United States Patent
Yu et al.

(10) Patent No.: US 11,988,696 B2
(45) Date of Patent: May 21, 2024

(54) METHOD FOR ANALYZING STABILITY OF PERMANENT MAGNET SYNCHRONOUS GENERATOR-BASED WIND TURBINES CONNECTED TO WEAK POWER GRID CONSIDERING INFLUENCE OF POWER CONTROL

(71) Applicant: ZHEJIANG UNIVERSITY, Hangzhou (CN)

(72) Inventors: Miao Yu, Hangzhou (CN); Jianing Liu, Hangzhou (CN); Lingxia Lu, Hangzhou (CN); Wei Wei, Hangzhou (CN)

(73) Assignee: ZHEJIANG UNIVERSITY, Hangzhou (CN)

( * ) Notice: Subject to any disclaimer, the term of this patent is extended or adjusted under 35 U.S.C. 154(b) by 375 days.

(21) Appl. No.: 17/556,839

(22) Filed: Dec. 20, 2021

(65) Prior Publication Data

US 2022/0357376 A1     Nov. 10, 2022

Related U.S. Application Data

(63) Continuation of application No. PCT/CN2021/089735, filed on Apr. 25, 2021.

(51) Int. Cl.
*G01R 19/25* (2006.01)
*H02J 3/38* (2006.01)

(52) U.S. Cl.
CPC .......... *G01R 19/2513* (2013.01); *H02J 3/381* (2013.01); *H02J 2203/20* (2020.01); *H02J 2300/28* (2020.01)

(58) Field of Classification Search
CPC ...... H02J 3/0012; H02J 3/381; H02J 2203/20; H02J 3/38; H02J 2300/28; G01R 19/2513; Y02E 10/76
See application file for complete search history.

(56) References Cited

U.S. PATENT DOCUMENTS

| | | | |
|---|---|---|---|
| 10,491,146 B2* | 11/2019 | Holliday | H02P 9/02 |
| 11,258,256 B2* | 2/2022 | Garcia | H02J 3/38 |
| 11,677,344 B2* | 6/2023 | Ma | F03D 17/00 |
| | | | 700/286 |

FOREIGN PATENT DOCUMENTS

| | | |
|---|---|---|
| CN | 103812127 A | 5/2014 |
| CN | 105589985 A | 5/2016 |

(Continued)

OTHER PUBLICATIONS

International Search Report (PCT/CN2021/089735); dated Jun. 30, 2021.

(Continued)

*Primary Examiner* — An H Do
(74) *Attorney, Agent, or Firm* — W&G Law Group

(57) ABSTRACT

Provided is a method for analyzing the stability of a PMSG-WT connected to a weak power grid considering the influence of power control. New energy power generation mostly uses a perturbation and observation (P&O) method for maximum power point tracking, and nonlinear discontinuous links therein make stability analysis difficult. The present application analyzes the stability of the PMSG-WT connected to the weak grid system based on a describing function method, and fully considers the nonlinear discontinuous links in the power loop, thus making the analysis result more accurate. At the same time, the describing function method is a method that can quantitatively calculate the frequency and amplitude of oscillation. The analysis method of the present application can provide a powerful and good reference for oscillation suppression and controller design.

5 Claims, 7 Drawing Sheets

(56) References Cited

FOREIGN PATENT DOCUMENTS

| | | | |
|---|---|---|---|
| CN | 109103903 | A | 12/2018 |
| CN | 109755964 | A | 5/2019 |
| CN | 109861265 | A | 6/2019 |
| CN | 111342484 | A | 6/2020 |
| CN | 112260290 | A | 1/2021 |
| KR | 20140039389 | A | 4/2014 |
| WO | 2017016617 | A1 | 2/2017 |

OTHER PUBLICATIONS

Stability Analysis and Compensator Design for PV Generators Based on Describing Function Method; Date of Mailing: Oct. 24, 2019.
Describing Function Method Based Power Oscillation Analysis of LCL-filtered Single-Stage PV Generators Connected to Weak Grid; Date of Mailing: Dec. 17, 2018.
Separated Frequency Stability Analysis of Grid-connected PV System Affected by Weak Grid; Date of Mailing: Jan. 30, 2020.
First Office Action(202110451859.4); dated Oct. 27, 2021.

\* cited by examiner

METHOD FOR ANALYZING STABILITY OF PERMANENT MAGNET SYNCHRONOUS GENERATOR-BASED WIND TURBINES CONNECTED TO WEAK POWER GRID CONSIDERING INFLUENCE OF POWER CONTROL

CROSS-REFERENCE TO RELATED APPLICATIONS

The present application is a continuation of International Application No. PCT/CN2021/089735, filed on Apr. 25, 2021, the content of which is incorporated herein by reference in its entirety.

TECHNICAL FIELD

The present application relates to a method for analyzing the stability of a permanent magnet synchronous generator-based wind turbine connected to a weak power grid considering the influence of power control, and belongs to the field of stability analysis of a new energy power generation system in an electrical power system.

BACKGROUND

The proportion of renewable energy power generation continues to increase, the installed capacity of wind power generation continues to grow, and the stable operation of a grid-connected wind power system has become an important issue. A permanent magnet synchronous generator (PMSG) based wind turbines (WTs) has the advantages of high energy conversion efficiency, good operational reliability and strong controllability, and the proportion of installed capacity continues to increase. In order to make better use of wind energy, a suitable maximum power point tracking algorithm must be adopted. A perturbation and observation (P&O) method does not need to measure the wind speed, and thus has a better practical value. However, the P&O method implies a nonlinear discontinuous link, which makes the traditional small-signal stability analysis method difficult to apply. The conventional stability analysis method generally ignores a power loop based on the P&O method. A describing function method can well complete the modeling of a nonlinear link and the stability analysis of the system, the basic idea is that when the system meets certain assumed conditions, under the action of sinusoidal input, the output of the nonlinear link of the system can be approximately expressed by its first harmonic component, so as to obtain the approximate equivalent frequency characteristics of the nonlinear link. Therefore, based on the describing function method, the present application proposes a method for analyzing the stability of a permanent magnet synchronous generator-based wind turbines (PMSG-WT) connected to a weak power grid considering the influence of power control, which fully considers the nonlinear link in the power loop, and improves the accuracy of stability analysis.

SUMMARY

The present application aims to provide a method for analyzing the stability of a PMSG-WT connected to a weak power grid considering the influence of power control. The PMSG-WT includes a wind turbine, a generator, a machine-side converter (MSC), a DC capacitor, a grid-side converter (GSC), a filter, an MSC controller, and a GSC controller. The MSC controller includes a power loop, a rotating speed loop, and a machine-side current loop; and the GSC controller includes a voltage loop and a grid-side current loop.

The present application adopts the following technical solutions:

Step 1: acquiring main parameters of the PMSG-WT, establishing mathematical models of the wind turbine, the generator and the MSC, the MSC controller, the DC capacitor, the GSC and the filter, and the GSC controller, respectively, performing linearization in a dq coordinate system, and calculating steady-state operation parameters to obtain small-signal models of the wind turbine, the generator and the MSC, the MSC controller, the DC capacitor, the GSC and the filter, and the GSC controller.

Step 2: modeling the power loop in the MSC controller based on a describing function method, wherein its mathematical expression is:

$$\omega_g^{ref} = \frac{\varepsilon}{T_P} \int \text{sgn}(P^{ref} - P_n)\text{sgn}(P_n - P_{n-1})\text{sgn}(\omega_{g,n} - \omega_{g,n-1})dt$$

where $\varepsilon$ represents a perturbation step length of the power loop, $T_p$ represents a control period of the power loop, $P^{ref}$ represents a reference value of the output power of the PMSG-WT, P represents an output power of the PMSG-WT, $P_n$ represents an output power of the PMSG-WT at the current sampling moment n, $P_{n-1}$ represents an output power of the PMSG-WT at the previous sampling moment, $\omega_g$ represents a rotating speed of the generator, $\omega_g^{ref}$ represents a reference value of the rotating speed of the generator, $\omega_{g,n}$ represents a rotating speed of the generator at the current sampling moment, and $\omega_{g,n-1}$ represents a rotating speed of the generator at the previous sampling moment. sgn(x) is a sign function, when x≥0, sgn(x)=1, and when x<0, sgn(x)=−1. Considering an actual power-rotating speed curve of the PMSG-WT, it can be deemed that:

$$\text{sgn}(P_n - P_{n-1})\text{sgn}(\omega_{g,n} - \omega_{g,n-1}) = \begin{cases} 1 & (\omega_g \leq \omega_{mpp}) \\ -1 & (\omega_g > \omega_{mpp}) \end{cases}$$

where $\omega_{mpp}$ represents the rotating speed of the generator at the maximum power point. Then, the power loop model can be simplified as:

$$\omega_g^{ref} = \begin{cases} \dfrac{\varepsilon}{T_P} \int \text{sgn}(P^{ref} - P_n)dt, & (\omega_g \leq \omega_{mpp}) \\ -\dfrac{\varepsilon}{T_P} \int \text{sgn}(P^{ref} - P_n)dt, & (\omega_g > \omega_{mpp}) \end{cases}$$

the sign function in the formula can be modeled by a describing function, and the describing function is:

$$N(A) = \frac{4}{\pi A}$$

in the formula, A represents an amplitude of an input signal.

Step 3: considering the influence of the weak AC power grid, combining the linear parts of the small-signal models of the weak power grid and the power loop with the small-signal model of the PMSG-WT established in step 1, and deriving a transfer function G(s) of the linear part of the system.

Step 4: drawing G(s) and −1/N(A) curves in a complex plane, and analyzing the stability of the system based on the describing function method, wherein the method is specifically that if G(s) contains a right-half-plane (RHP) pole, the system must be unstable; if the G(s) does not contain any RHP pole, then judging the stability of the system through the relationship between the G(s) curve and the −1/N (A) curve:

a. if the G(s) curve does not surround the −1/N(A) curve, the system is stable and does not oscillate;
b. if the G(s) curve and the −1/N(A) curve intersect, the system is critically stable, at this time, the system oscillates at a constant amplitude and a constant frequency, and the frequency and amplitude of the oscillation can be calculated by the following formula:

$$\begin{cases} G_{Im}(\omega_0) = 0 \\ N(A_0) = -1/G_{Re}(\omega_0) \end{cases}$$

where $G(j\omega) = G_{Re}(\omega) + jG_{Im}(\omega)$, $G_{Re}$ means to find the real part of a complex number, $G_{Im}$ means to find the imaginary part of the complex number, $\omega_0$ represents an angular frequency of the oscillation, and $A_0$ represents the amplitude of the oscillation; and c. if the G(s) curve surrounds the −1/N(A) curve, the system is unstable.

Further, in step 1, the small-signal models of the wind turbine, the generator and the MSC, and the MSC controller are established as follows:

the mathematical model of the wind turbine is established as:

$$sJ\omega_g = T_m - T_e - B\omega_g$$

in the formula, J represents rotational inertia of an equivalent concentrated mass block of the wind turbine and the generator, $T_m$ represents a mechanical torque of the generator, $T_e$ represents an electromagnetic torque of the generator, B represents a self-damping coefficient, it is deemed that B=0 herein, and s represents a parameter introduced by the Laplace transform. Linearization is performed on the model to obtain:

$$sJ\Delta\omega_g = \Delta T_m - \Delta T_e$$

the electromagnetic torque of the generator is:

$$T_e = 3/2 n_p \psi_f i_{qr}$$

$n_p$ represents the number of pole pairs of the generator, $i_{qr}$ represents stator current of the q-axis generator, and $\psi_f$ represents a permanent magnet flux linkage of the generator. This formula is linearized to obtain:

$$\Delta T_e = 3/2 n_p \psi_f \Delta i_{qr}$$

the mechanical torque of the generator is:

$$T_m = B_t \omega_g$$

in the formula, $$B_t = \frac{dT_m}{d\omega_g}\bigg|_{\omega_g = \omega_g^*}$$

represents a linearization constant of the mechanical torque of the wind turbine, and $\omega_g^*$ represents a steady-state value of the rotating speed of the generator, which is a specific constant at an equilibrium point. This formula is linearized to obtain:

$$\Delta T_m = B_t \Delta \omega_g$$

from this, the small-signal model of the wind turbine can be obtained, $$\Delta\omega_g = \frac{3n_p \psi f}{2(B_t - sJ)} \Delta i_{qr} = \begin{bmatrix} 0 & \frac{3n_p \psi f}{2(B_t - sJ)} \end{bmatrix} \cdot \Delta i_{dqr}$$

setting $$G_{iq\omega} = \begin{bmatrix} 0 & \frac{3n_p \psi f}{2(B_t - sJ)} \end{bmatrix},$$

then $$\Delta\omega_g = G_{iq\omega} \cdot \Delta i_{dqr}, \Delta\omega_e = n_p G_{iq\omega} \cdot \Delta i_{dqr}.$$

The mathematical model of the generator and the MSC is:

$$\begin{bmatrix} sL_s + R_s & -\omega_e L_s \\ \omega_e L_s & sL_s + R_s \end{bmatrix} \cdot \begin{bmatrix} i_{dr} \\ i_{qr} \end{bmatrix} = \begin{bmatrix} 0 \\ \omega_e \psi_f \end{bmatrix} - \begin{bmatrix} d_{dr} \\ d_{qr} \end{bmatrix} \cdot u_{dc}$$

in the formula, $R_s$ and $L_s$ represent rotor resistance and armature inductance of the generator, respectively, $\omega_e$ represents an electrical angular speed of the rotor, and $\omega_e = n_p \omega_g$. $i_{dr}$ and $i_{qr}$ represent the stator current of the generator in the dq coordinate system, $d_{dr}$ and $d_{qr}$ represent output duty ratios of the MSC controller in the dq coordinate system, $u_{dc}$ represents a DC voltage. By linearizing the model, the small-signal model of the generator and MSC can be obtained as:

$$Z_{dqr} \cdot \Delta i_{dqr} = -U^*_{dc} \cdot \Delta d_{dqr} - D^*_{dqr} \cdot \Delta u_{dc} + G_{\omega e} \cdot \Delta \omega_e$$

where $$Z_{dqr} = \begin{bmatrix} sL_s + R_s & -\omega_e L_s \\ \omega_e L_s & sL_s + R_s \end{bmatrix}, \Delta i_{dqr} = \begin{bmatrix} \Delta i_{dr} \\ \Delta i_{qr} \end{bmatrix}, \Delta d_{dqr} = \begin{bmatrix} \Delta d_{dr} \\ \Delta d_{qr} \end{bmatrix},$$

$$D^*_{dqr} = \begin{bmatrix} D^*_{dr} \\ D^*_{qr} \end{bmatrix}, G_{\omega e} = \begin{bmatrix} L_s I^*_{qr} \\ \psi_f - L_s I^*_{dr} \end{bmatrix};$$

and capital letters and superscripts * represent steady-state components of corresponding lowercase variables, and Δ represents a small-signal component of the corresponding variable.

The mathematical model of the MSC controller is established as:

$$\begin{cases} d^c_{dr} U^*_{dc} = -H_{cr}(0 - i^c_{dr}) + \omega_e L_s i^c_{dr} \\ d^c_{qr} U^*_{dc} = -H_{cr}\left(-H_\omega(\omega_g^{ref} - \omega_g) - i^c_{qr}\right) - \omega_e L_s i^c_{dr} + \omega_e \psi_f \end{cases}$$

where $$H_{cr} = K_{cpr} + \frac{K_{cir}}{s},$$

$K_{cpr}$ and $K_{cir}$ represent a proportional parameter and an integral parameter of machine-side current loop PI control, respectively, $$H_\omega = K_{\omega p} + \frac{K_{\omega i}}{s},$$

and $K_{\omega p}$ and $K_{\omega i}$ represent the proportional parameter and the integral parameter of rotating speed loop PI control, respectively. Superscript c represents a dq coordinate system of the MSC controller. $\omega_g^{ref}$ represents the reference value of the rotating speed of the generator. By linearizing the model, the small-signal model of the MSC controller can be obtained as:

$$\Delta d_{dqr}^c = \frac{1}{U_{dc}^*}(G_{cr} \cdot \Delta i_{dqr}^c + G_{\omega g}(\omega_g^{ref} - \omega_g) + G_{\omega e} \cdot \Delta \omega_e) \text{ where}$$

$$G_{cr} = \begin{bmatrix} H_{cr} & \omega_e^* L_s \\ -\omega_e^* L_s & H_{cr} \end{bmatrix}, G_{\omega g} = \begin{bmatrix} 0 \\ H_{cr} H_\omega \end{bmatrix}.$$

$\omega_e^*$ represents the steady-state value of the electrical angular speed of the rotor. Affected by the disturbance of the rotating speed, the dq coordinate system of the MSC controller will have a phase angle difference with the dq coordinate system of the generator during the dynamic process. The electrical angle of the generator is:

$$\theta_e = n_p \omega_g/s$$

the formula is linearized to obtain:

$$\Delta \theta_e = \frac{n_p \Delta \omega_g}{s} = \frac{3n_p^2 \psi_f}{2s(B_t - sJ)} \Delta i_{qr} = H_{\theta e} \Delta i_{qr}$$

in the formula, $$H_{\theta e} = \frac{3n_p^2 \psi_f}{2s(B_t - sJ)}.$$

Therefore, the variable conversion relationship between the dq coordinate system of the MSC controller and the dq coordinate system of the generator is:

$$\begin{cases} \Delta i_{dqr}^c = G_{\theta e}^i \cdot \Delta i_{dqr} \\ \Delta d_{dqr}^c = G_{\theta e}^d \cdot \Delta i_{dqr} + \Delta d_{dqr} \end{cases} \text{ where}$$

$$G_{\theta e}^i = \begin{bmatrix} 1 & H_{\theta e} I_{qr}^* \\ 0 & 1 - H_{\theta e} I_{dr}^* \end{bmatrix}, G_{\theta e}^d = \begin{bmatrix} 0 & H_{\theta e} D_{qr}^* \\ 0 & -H_{\theta e} D_{dr}^* \end{bmatrix}.$$

Then, the small-signal model of the MSC controller is:

$$G_{\theta e}^d \cdot \Delta i_{dqr} + \Delta d_{dqr} = \frac{1}{U_{dc}^*}(G_{cr} \cdot G_{\theta e}^i \cdot \Delta i_{dqr} + G_{\omega g}(\omega_g^{ref} - \omega_g) + G_{\omega e} \cdot \Delta \omega_e).$$

Further, in step 1, the establishment process of the small-signal model is as follows:

the mathematical model of the DC capacitor is established as:

$$sC_{dc}u_{dc} = i_{dc2} - i_{dc1} = 1.5(d_{dr}i_{dr} + d_{qr}i_{qr}) - 1.5(d_{dg}i_{dg} + d_{qg}i_{qg})$$

in the formula, $C_{dc}$ represents the DC capacitor, $i_{dc1}$ represents grid-side DC current, $i_{dc2}$ represents machine-side DC current, $i_{dg}$ and $i_{qg}$ represent d-axis current and q-axis current of the AC port of the GSC, respectively, and $d_{dg}$ and $d_{qg}$ represent the output duty ratios of the GSC controller in the dq coordinate system, respectively. $u_{dc}$ represents the DC voltage, $i_{dr}$ and $i_{qr}$ represent the stator current of the generator in the dq coordinate system, respectively, $d_{dr}$ and $d_{qr}$ represent the output duty ratios of the MSC controller in the dq coordinate system, respectively, and by linearizing the model, the small-signal model of the DC capacitor can be obtained as:

$$sC_{dc}\Delta u_{dc} = 1.5(D_{dqr}^{*T} \cdot \Delta i_{dqr} + I_{dqr}^{*T} \cdot \Delta d_{dqr}) - 1.5(D_{dqg}^{*T} \cdot \Delta i_{dqg} + I_{dqg}^{*T} \cdot \Delta d_{dqg})$$

in the formula, $$\Delta i_{dqr} = \begin{bmatrix} \Delta i_{dr} \\ \Delta i_{qr} \end{bmatrix}, \Delta d_{dqg} = \begin{bmatrix} \Delta d_{dg} \\ \Delta d_{qg} \end{bmatrix}, D_{dqg}^* = \begin{bmatrix} D_{dg}^* \\ D_{qg}^* \end{bmatrix}, I_{dqg}^* = \begin{bmatrix} I_{dg}^* \\ I_{qg}^* \end{bmatrix}.$$

The capital letters and the superscripts * represent the steady-state components of corresponding lowercase variables, and $\Delta$ represents the small-signal component of the corresponding variable.

Further, in step 1, the establishment process of the small-signal models of the GSC and the filter, and the GSC controller is as follows:

the mathematical model of the GSC and the filter is established as:

$$\begin{bmatrix} sL_f & -\omega L_f \\ \omega L_f & sL_f \end{bmatrix} \cdot \begin{bmatrix} i_{dg} \\ i_{qg} \end{bmatrix} = \begin{bmatrix} d_{dg} \\ d_{qg} \end{bmatrix} \cdot u_{dc} - \begin{bmatrix} u_{dg} \\ u_{qg} \end{bmatrix}$$

in the formula, $L_f$ represents a filtering inductance, $\omega$ represents a power frequency angular frequency, $\omega = 100\pi$ rad/s, $i_{dg}$ and $i_{qg}$ represent the d-axis current and the q-axis current of the AC port of the GSC, respectively, $d_{dg}$ and $d_{qg}$ represent the output duty ratios of the GSC controller in the dq coordinate system, respectively, $u_{dc}$ represents the DC voltage, and $u_{dg}$ and $u_{qg}$ represent a d-axis voltage and a q-axis voltage of a grid-connected point, respectively. By linearizing the model, the small-signal model of the GSC and the filter can be obtained as:

$$Z_f \Delta i_{dqg} = U_{dc}^* \cdot \Delta d_{dqg} + D_{dqg}^* \cdot \Delta u_{dc} - \Delta u_{dqg}$$

where $$Z_f = \begin{bmatrix} sL_f & -\omega L_f \\ \omega L_f & sL_f \end{bmatrix}, \Delta i_{dqg} = \begin{bmatrix} \Delta i_{dg} \\ \Delta i_{qg} \end{bmatrix},$$

$$\Delta d_{dqg} = \begin{bmatrix} \Delta d_{dg} \\ \Delta d_{qg} \end{bmatrix}, D_{dqg}^* = \begin{bmatrix} D_{dg}^* \\ D_{qg}^* \end{bmatrix}.$$

The capital letters and the superscripts * represent the steady-state components of corresponding lowercase variables, and $\Delta$ represents the small-signal component of the corresponding variable.

The mathematical model of the GSC controller is established as:

$$\begin{cases} d_{dg}^c U_{dc}^* = u_{dg}^c + H_{cg}(-H_v(U_{dcref} - u_{dc}) - i_{dg}^c) - \omega L_f i_{qg}^c \\ d_{qg}^c U_{dc}^* = u_{qg}^c + H_{cg}(0 - i_{qg}^c) + \omega L_f i_{dg}^c \end{cases}$$

where $$H_{cg} = K_{cpg} + \frac{K_{cig}}{s},$$

$K_{cpg}$ and $K_{cig}$ represent a proportional parameter and an integral parameter of grid-side current loop PI control, respectively, $$H_v = K_{vp} + \frac{K_{vi}}{s},$$

and $K_{vp}$ and $K_{vi}$ represent the proportional parameter and the integral parameter of grid-side voltage loop PI control, respectively. $U_{dcref}$ represents the reference value of the DC voltage. In the GSC controller, a phase-locked loop is used to keep the PMSG-WT synchronous with the power grid. The superscript c represents the dq coordinate system of the GSC controller. By linearizing the model, the small-signal model of the GSC controller can be obtained as:

$$\Delta d_{dqg}{}^c \cdot U^*_{dc} = \Delta u_{dqg}{}^c + G_{cg} \Delta i_{dqg}{}^c + G_{udc} \Delta u_{dc}$$

where $$G_{cg} = \begin{bmatrix} -H_{cg} & -\omega L_f \\ \omega L_f & -H_{cg} \end{bmatrix}, G_{udc} = \begin{bmatrix} H_{cg} H_v \\ 0 \end{bmatrix}.$$

In addition, the dynamics of the phase-locked loop should also be considered in the GSC, and its mathematical model is:

$$\theta = H_{pll} \cdot \frac{1}{s} \cdot u^c_{qg}$$

where $$H_{pll} = K_{ppll} + \frac{K_{ipll}}{s},$$

$K_{pll}$ and $K_{ipll}$ represent the proportional parameter and the integral parameter of a phase-locked loop PI controller, respectively, and $u_{qg}{}^c$ represents the q-axis voltage of the grid-connected point in the dq coordinate system of the GSC controller. The model is linearized to obtain:

$$\Delta \theta = H_{pll} \cdot \frac{1}{s} \cdot \Delta u^c_{qg}$$

wherein there is a certain deviation between the dq coordinate system of the system and the dq coordinate system of the controller, and the two coordinate systems can be converted to each other through the following equation:

$$\begin{cases} \Delta x^c_d = \Delta x_d + \Delta \theta \cdot X^*_q \\ \Delta x^c_q = \Delta x_q + \Delta \theta \cdot X^*_d \end{cases}$$

in the formula, the variables $\Delta x_d$ and $\Delta x_q$ may represent the output current $\Delta i_{dg}$ and $\Delta i_{qg}$ of the GSC, the voltages $\Delta u_{dg}$ and $\Delta u_{qg}$ of the grid-connected point, or the output duty ratios $\Delta d_{dg}$ and $\Delta d_{qg}$ of the grid-side controller, and $X^*_q$ and $X^*_d$ represent steady-state components $I^*_{qg}$, $I^*_{dg}$, $U^*_{qg}$, $U^*_{dg}$, $D^*_{qg}$, $D^*_{dg}$.

From this, the small-signal model of the phase-locked loop can be derived, namely:

$$\Delta \theta = G_{pll} \cdot \Delta u_{qg}$$

where $$G_{pll} = \frac{H_{pll}}{s + U^*_{dg} H_{pll}},$$

and then the relationship between the dq coordinate system of the controller and the dq coordinate system of the system can be obtained as:

$$\begin{cases} \Delta u^c_{dqg} = G^u_{pll} \cdot \Delta u_{dqg} \\ \Delta i^c_{dqg} = G^i_{pll} \cdot \Delta u_{dqg} + \Delta i_{dqg} \\ \Delta d^c_{dqg} = G^d_{pll} \cdot \Delta u_{dqg} + \Delta d_{dqg} \end{cases}$$

where $$G^u_{pll} = \begin{bmatrix} 1 & G_{pll} U^*_{qg} \\ 0 & 1 - G_{pll} U^*_{dg} \end{bmatrix}, G^i_{pll} = \begin{bmatrix} 0 & G_{pll} I^*_{qg} \\ 0 & -G_{pll} I^*_{dg} \end{bmatrix}, G^d_{pll} = \begin{bmatrix} 0 & G_{pll} D^*_{qg} \\ 0 & -G_{pll} D^*_{dg} \end{bmatrix}.$$

Then, the small-signal model of the GSC controller is converted into:

$$(G^d_{pll} \cdot \Delta u_{dqg} + \Delta d_{dqg}) \cdot U^*_{dc} = G^u_{pll} \cdot \Delta u_{dqg} + G_{cg}(G^i_{pll} \cdot \Delta u_{dqg} + \Delta i_{dqg}) + G_{udc} \Delta u_{dc}$$

Further, the step 3 is specifically:

the AC weak power grid is expressed by series equivalent inductance of an ideal voltage source, and its mathematical model is established as:

$$\begin{bmatrix} sL_g & -\omega L_g \\ \omega L_g & sL_g \end{bmatrix} \cdot \begin{bmatrix} i_{dg} \\ i_{qg} \end{bmatrix} = \begin{bmatrix} u_{dg} \\ u_{qg} \end{bmatrix} - \begin{bmatrix} u_{ds} \\ u_{qs} \end{bmatrix}$$

in the formula, $L_g$ represents the equivalent inductance of the weak grid, $u_{ds}$ and $u_{qs}$ represent ideal voltage source voltages of the d axis and the q axis, respectively, and $i_{dg}$ and $i_{qg}$ represent the d axis current and the q axis current of the AC port of the GSC, respectively. The formula is linearized to obtain:

$$Z_g \cdot \Delta i_{dqg} = \Delta u_{dqg}$$

in the formula, $$Z_g = \begin{bmatrix} sL_g & -\omega L_g \\ \omega L_g & sL_g \end{bmatrix}.$$

The output power of the PMSG-WT is:

$$P = 1.5(i_{dg} u_{dg} + i_{qg} u_{qg})$$

The formula is linearized to obtain:

$$\Delta P = 1.5(I^{*T}_{dqg} \cdot Z_g + U^{*T}_{dqg}) \cdot \Delta i_{dqg}$$

in the formula, $$U_{dqg}^* = \begin{bmatrix} U_{dg}^* \\ U_{qg}^* \end{bmatrix}.$$

By combining the linear parts of various part models of the aforementioned PMSG-WT grid-connected system, the transfer function G(s) of the linear part of the system can be obtained as:

$$G(s) = -\frac{1.5\varepsilon}{T_p s}(I_{dqg}^{*T} Z_g + U_{dqg}^{*T}) M_5^{-1}(D_{dqg}^* + G_{udc}) M_7^{-1} M_8 \cdot \frac{1}{1+T_f s} \cdot \frac{1}{1+1.5T_p s}$$

$$M_8 = -D_{dqr}^{*T} \cdot M_1^{-1} \cdot G_{\omega g} + I_{dqr}^{*T} \cdot M_3$$

$$M_7 = \left(\frac{2sC_{dc}}{3} + I_{dqg}^{*T} M_6 - I_{dqr}^{*T} M_4 + D_{dqg}^{*T} M_5^{-1}(D_{dqg}^* + G_{udc}) + D_{dqr}^{*T} M_1^{-1} D_{dqr}^*\right)$$

$$M_6 = \left(\left((G_{cg} G_{pll}^i - G_{pll}^d U_{dc}^* + G_{pll}^u) Z_g + G_{cg}\right) M_5^{-1}(D_{dqg}^* + G_{udc}) + G_{udc}\right)/U_{dc}^*$$

$$M_5 = -G_{cg} + Z_f - \left((G_{cg} G_{pll}^i - G_{pll}^d U_{dc}^* + G_{pll}^u) Z_g + Z_g\right)$$

$$M_4 = -M_2 M_1^{-1} D_{dqr}^* / U_{dc}^*$$

$$M_3 = \left(-M_2 M_1^{-1} G_{\omega g} + G_{\omega g}\right)/U_{dc}^*$$

$$M_2 = G_{\omega e} G_{iq\omega} n_p + G_{cr} G_{\theta e}^i - G_{\omega g} G_{iq\omega} - U_{dc}^* G_{\theta e}^d$$

$$M_1 = G_{cr} G_{\theta e}^i - G_{\omega g} G_{iq\omega} - U_{dc}^* G_{\theta e}^d + Z_{dqr}$$

in the formula, $T_f$ represents the period of a power sampling filter, $1/(1+T_f s)$ represents the delay of the power sampling filter, and $1/(1+1.5T_p s)$ represents the delay of the controller and the PWM.

Compared with the prior art, the present application has the advantages that:

(1) the present application applies the describing function method to the stability analysis of the grid-connected PMSG-WT system, fully considers the nonlinear link in the power loop based on the P&O method, and overcomes the problem that the traditional small-signal analysis method cannot be applied to discontinuous nonlinear links.

(2) When the system is in a critically stable state, oscillation occurs at constant amplitude and constant frequency. The describing function method can quantitatively calculate the frequency and amplitude of the oscillation, which provides an important basis for the prevention and suppression of the oscillation.

DESCRIPTION OF EMBODIMENTS

Figure 1:
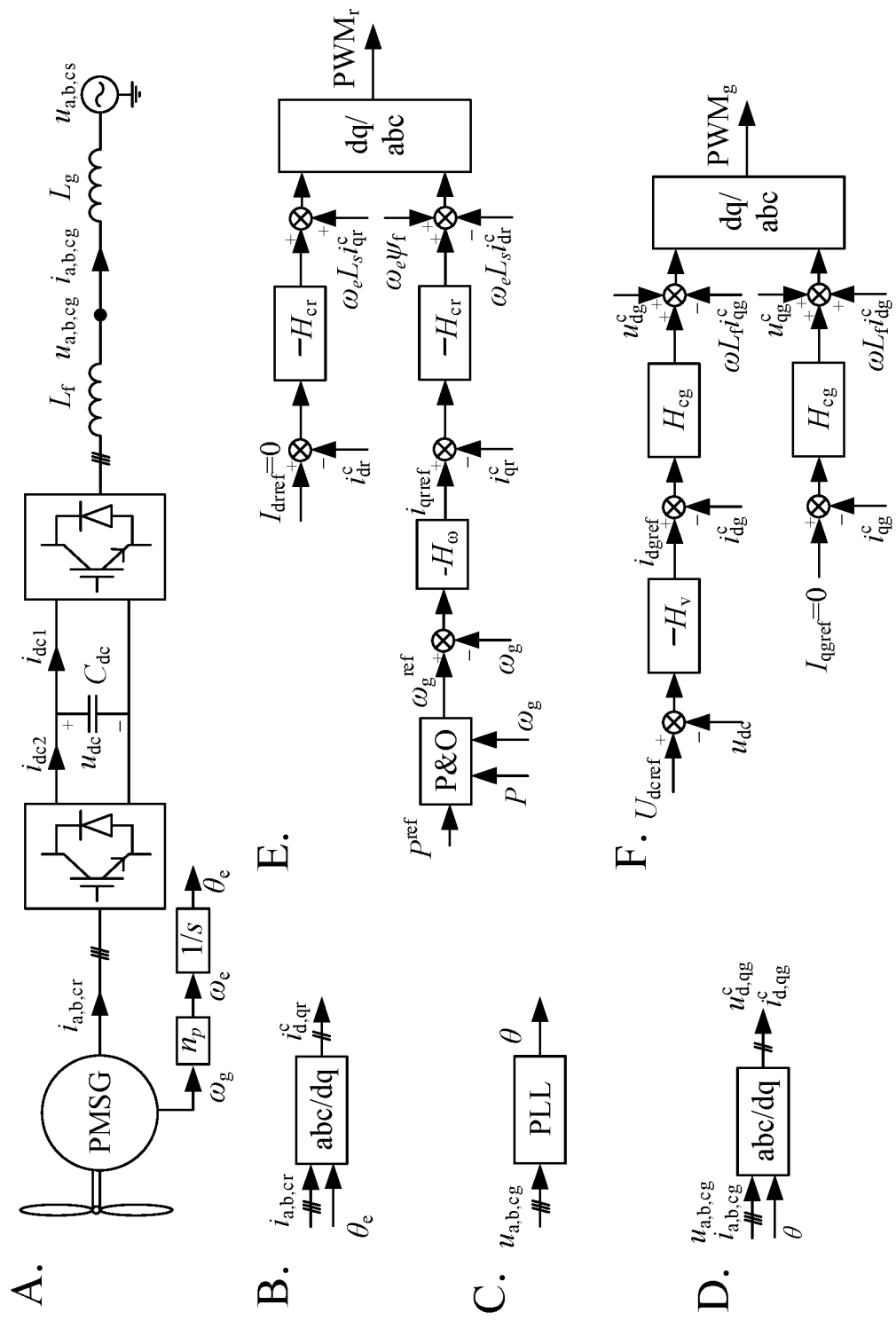
FIG. 1 shows a topological structure (A) of a PMSG-WT and its controller structure (B and D represent coordinate conversion, C represents a phase-locked loop, E represents an MSC controller, and F represents a GSC controller)

The topological structure of the PMSG-WT and its controller according to the present application are shown in FIG. 1. The PMSG-WT includes a wind turbine, a generator, an MSC, a DC capacitor, a GSC, and a filter. The wind turbine captures wind energy and converts the wind energy into mechanical energy, both the MSC and the GSC are two-level voltage source converters, wherein the MSC converts the alternating current output by the permanent magnet synchronous generator into direct current, and the GSC inverts the direct current into power frequency alternating current and integrates the power frequency alternating current into the power grid. Both the MSC and the GSC adopt a vector control method in a dq coordinate system, and convert three-phase voltage and current under the abc frame into the voltage and current under d-axis and q-axis through dq transformation. The MSC controller includes a power loop (P&O), a rotating speed loop ($H_\omega$), and a machine-side current loop ($H_{cr}$); and the GSC controller includes a voltage loop ($H_v$) and a grid-side current loop ($H_{cg}$). In addition, the PMSG-WT also includes a phase-locked loop (PLL) and coordinate conversion links (abc/dq and dq/abc). Hereinafter, the present application will be further described in combination with specific embodiments:

In one embodiment of the present application, main parameters of the system are shown in Table 1.

TABLE 1

| Main parameters of the system | |
|---|---|
| Parameter | Value |
| Equivalent inductance of a weak power grid $L_g$ | 0.1 mH |
| Voltage amplitude of an ideal voltage source of the weak power grid $U_s$ | 690√2/√3 |
| Filtering inductance $L_f$ | 1.2 mH |
| DC capacitor $C_{dc}$ | 2 mF |
| Armature inductance of the generator $L_s$ | 1.5028 mH |
| Rotor resistance of generator $R_s$ | 0.0224 Ω |
| Permanent magnet flux linkage $\psi_f$ | 5.3445 Wb |
| Power frequency angular frequency ω | 100π rad/s |
| The number of pole pairs of the generator $n_p$ | 48 |

TABLE 1-continued

Main parameters of the system

| Parameter | Value |
|---|---|
| Equivalent rotational inertia J | 1417769.4 |
| Perturbation step length of a power loop ε | 0.0001 rad/s |
| Control period of the power loop $T_p$ | 0.1 ms |
| Reference value of output power of the PMSG-WT $P^{ref}$ | 0.688 MW |
| Proportional parameter of a rotating speed loop $K_{\omega p}$ | 10902 |
| Integral parameter of the rotating speed loop $K_{\omega i}$ | 17875 |
| Proportional parameter of a machine-side current $K_{cpr}$ | 3.13 |
| Integral parameter of the machine-side current loop $K_{cir}$ | 109.8 |
| Proportional parameter of a grid-side current loop $K_{cpg}$ | 19.05 |
| Integral parameter of the grid-side current loop $K_{cig}$ | 176 |
| Proportional parameter of a grid-side voltage loop $K_{vp}$ | 1.6 |
| Integral parameter of the grid-side voltage loop $K_{vi}$ | 28 |
| Proportional parameter of the phase-locked loop $K_{ppll}$ | 2.1 |
| Integral parameter of the phase-locked loop $K_{ipll}$ | 36.6 |

TABLE 1-continued

Main parameters of the system

| Parameter | Value |
|---|---|
| Reference value of DC voltage $U_{dcref}$ | 1400 V |
| Steady-state value of rotating speed of the generator $\omega_g^*$ | 3 rad/s |

TABLE 1-continued

Main parameters of the system

| Parameter | Value |
|---|---|
| Linearization constant of a mechanical torque of the wind turbine $B_t$ | $-2.742 \times 10^5$ |
| Period of a power sampling filter $T_f$ | 0.01 |

In the embodiment of the present application, step 1, acquiring main parameters of the PMSG-WT, wherein the main parameters as shown in Table 1, establishing mathematical models of the wind turbine, the generator and the MSC, the MSC controller, the DC capacitor, the GSC and the filter, and the GSC controller, respectively, performing linearization in a dq coordinate system, and calculating steady-state operation parameters to obtain small-signal models of the wind turbine, the generator and the MSC, the MSC controller, the DC capacitor, the GSC and the filter, and the GSC controller:

$$sJ\Delta\omega_g = \Delta T_m - \Delta T_e$$

$$\Delta T_e = -\frac{3}{2}n_p\psi_f\Delta i_{qr}$$

$$\Delta T_m = B_t\Delta\omega_g$$

$$Z_{dqr} \cdot \Delta i_{dqr} = -U_{dc}^* \cdot \Delta d_{dqr} - D_{dqr}^* \cdot \Delta u_{dc} + G_{\omega e} \cdot \Delta\omega_e$$

$$\Delta d_{dqr}^c = \frac{1}{U_{dc}^*}\left(G_{cr} \cdot \Delta i_{dqr}^c + G_{\omega g}(\omega_g^{ref} - \omega_g) + G_{\omega e} \cdot \Delta\omega_e\right)$$

$$\begin{cases} \Delta i_{dqr}^c = G_{\theta e}^i \cdot \Delta i_{dqr} \\ \Delta d_{dqg}^c = G_{\theta e}^d \cdot \Delta i_{dqr} + \Delta d_{dqg} \end{cases}$$

$$sC_{dc}\Delta u_{dc} = 1.5\left(D_{dqr}^{*T} \cdot \Delta i_{dqr} + I_{dqr}^{*T} \cdot \Delta d_{dqr}\right) - 1.5\left(D_{dqg}^{*T} \cdot \Delta i_{dqg} + I_{dqg}^{*T} \cdot \Delta d_{dqg}\right)$$

$$Z_f \cdot \Delta i_{dqg} = U_{dc}^* \cdot \Delta d_{dqg} + D_{dqg}^* \cdot \Delta u_{dc} - \Delta u_{dqg}$$

$$\Delta d_{dqg}^c \cdot U_{dc}^* = \Delta u_{dqg}^c + G_{cg}\Delta i_{dqg}^c + G_{udc}\Delta u_{dc}$$

$$\begin{cases} \Delta u_{dqg}^c = G_{pll}^u \cdot \Delta u_{dqg} \\ \Delta i_{dqg}^c = G_{pll}^i \cdot \Delta u_{dqg} + \Delta i_{dqg} \\ \Delta d_{dqg}^c = G_{pll}^d \cdot \Delta u_{dqg} + \Delta d_{dqg} \end{cases}$$

s represents a parameter introduced by the Laplace transform, J represents rotational inertia of an equivalent concentrated mass block of the wind turbine and the generator, $\omega_g$ represents a rotating speed of the generator, $T_m$ represents a mechanical torque of the generator, and $T_e$ represents an electromagnetic torque of the generator. $n_p$ represents the number of pole pairs of the generator, $\psi_f$ represents a permanent magnet flux linkage of the generator, and $B_t$ represents a linearization constant of the mechanical torque of the wind turbine.

$$Z_{dqr} = \begin{bmatrix} sL_s + R_s & -\omega_e^*L_s \\ \omega_e^*L_s & sL_s + R_s \end{bmatrix}, \Delta i_{dqr} = \begin{bmatrix} \Delta i_{dr} \\ \Delta i_{qr} \end{bmatrix}, \Delta d_{dqr} = \begin{bmatrix} \Delta d_{dr} \\ \Delta d_{qr} \end{bmatrix}, D_{dqr}^* = \begin{bmatrix} D_{dr}^* \\ D_{qr}^* \end{bmatrix}, G_{\omega e} = \begin{bmatrix} L_s I_{qr}^* \\ \psi_f - L_s I_{dr}^* \end{bmatrix},$$

$R_s$ and $L_s$ represent rotor resistance and armature inductance of the generator, respectively, $\omega_e$ represents an electrical angular speed of the rotor, and $\omega_e = n_p \omega_g$. $i_{dr}$ and $i_{qr}$ represent the stator current of the generator in the dq coordinate system, $d_{dr}$ and $d_{qr}$ represent output duty ratios of the MSC controller in the dq coordinate system, and $u_{dc}$ represents a DC voltage.

$$G_{cr} = \begin{bmatrix} H_{cr} & \omega_e^* L_s \\ -\omega_e^* L_s & H_{cr} \end{bmatrix}, G_{\omega g} = \begin{bmatrix} 0 \\ H_{cr} H_\omega \end{bmatrix}, H_{cr} = K_{cpr} + \frac{K_{cir}}{s},$$

$K_{cpr}$ and $K_{cir}$ represent a proportional parameter and an integral parameter of machine-side current loop PI control, respectively, $$H_\omega = K_{\omega p} + \frac{K_{\omega i}}{s},$$

$K_{\omega p}$ and $K_{\omega i}$ represent the proportional parameter and the integral parameter of rotating speed loop PI control, respectively, $\omega_g^{ref}$ represents the reference value of the rotating speed of the generator, $\omega^*_e$ represents the steady-state value of the electrical angular speed of the rotor, and the superscript c represents a dq coordinate system of the MSC controller.

$$G_{\theta e}^i = \begin{bmatrix} 1 & H_{\theta e} I_{qr}^* \\ 0 & 1 - H_{\theta e} I_{dr}^* \end{bmatrix}, G_{\theta e}^d = \begin{bmatrix} 0 & H_{\theta e} D_{qr}^* \\ 0 & -H_{\theta e} D_{dr}^* \end{bmatrix}, H_{\theta e} = \frac{3 n_p^2 \psi_f}{2 s (B_t - sJ)} \cdot I_{dqr}^* \begin{bmatrix} I_{dr}^* \\ I_{qr}^* \end{bmatrix},$$

$$\Delta i_{dqg} = \begin{bmatrix} \Delta i_{dg} \\ \Delta i_{qg} \end{bmatrix}, \Delta d_{dqg} = \begin{bmatrix} \Delta d_{dg} \\ \Delta d_{qg} \end{bmatrix}, D_{dqg}^* = \begin{bmatrix} D_{dg}^* \\ D_{qg}^* \end{bmatrix}, I_{dqg}^* = \begin{bmatrix} I_{dg}^* \\ I_{qg}^* \end{bmatrix},$$

$C_{dc}$ represents the DC capacitor, $i_{dg}$ and $i_{qg}$ represent d-axis current and q-axis current of an AC port of the GSC, respectively, and $d_{dg}$ and $d_{qg}$ represent the output duty ratios of the GSC controller in the dq coordinate system, respectively.

$$Z_f = \begin{bmatrix} sL_f & -\omega L_f \\ \omega L_f & sL_f \end{bmatrix}, \Delta i_{dqg} = \begin{bmatrix} \Delta i_{dg} \\ \Delta i_{qg} \end{bmatrix},$$

$$\Delta d_{dqg} = \begin{bmatrix} \Delta d_{dg} \\ \Delta d_{qg} \end{bmatrix}, D_{dqg}^* = \begin{bmatrix} D_{dg}^* \\ D_{qg}^* \end{bmatrix}, \Delta u_{dqg} = \begin{bmatrix} \Delta u_{dg} \\ \Delta u_{qg} \end{bmatrix},$$

$L_f$ represents filtering inductance, $\omega$ represents power frequency angular frequency, $\omega = 100\pi$ rad/s, $i_{dg}$ and $i_{qg}$ represent the d-axis current and the q-axis current of the AC port of the GSC, respectively, $d_{dg}$ and $d_{qg}$ represent the output duty ratios of the GSC controller in the dq coordinate system, respectively, and $u_{dg}$ and $u_{qg}$ represent a d-axis voltage and a q-axis voltage of a grid-connected point, respectively.

$$G_{cg} = \begin{bmatrix} -H_{cg} & -\omega L_f \\ \omega L_f & -H_{cg} \end{bmatrix}, G_{udc} = \begin{bmatrix} H_{cg} H_v \\ 0 \end{bmatrix}, H_{cg} = K_{cpg} + \frac{K_{cig}}{s},$$

$K_{cpg}$ and $K_{cig}$ represent the proportional parameter and the integral parameter of grid-side current loop PI control, respectively, $$H_v = K_{vp} + \frac{K_{vi}}{s},$$

and $K_{vp}$ and $K_{vi}$ represent the proportional parameter and the integral parameter of grid-side voltage loop PI control, respectively.

$$G_{pll}^u = \begin{bmatrix} 1 & G_{pll} U_{qg}^* \\ 0 & 1 - G_{pll} U_{dg}^* \end{bmatrix}, G_{pll}^i = \begin{bmatrix} 0 & G_{pll} I_{qg}^* \\ 0 & -G_{pll} I_{dg}^* \end{bmatrix},$$

$$G_{pll}^d = \begin{bmatrix} 0 & G_{pll} D_{qg}^* \\ 0 & -G_{pll} D_{dg}^* \end{bmatrix}, G_{pll} = \frac{H_{pll}}{s + U_{dg}^* H_{pll}}, H_{pll} = K_{ppll} + \frac{K_{ipll}}{s},$$

$K_{ppll}$ and $K_{ipll}$ represent the proportional parameter and the integral parameter of a phase-locked loop PI controller, respectively.

Capital letters and superscripts * represent steady-state components of corresponding lowercase variables, and the specific calculation method is as follows:

$$\begin{cases} I_{qr}^* = 3P^{ref}/n_p \Psi_f \omega_g^* \\ I_{dr}^* = 0 \\ U_{dc}^* = U_{dcref} \\ D_{dr}^* = (\omega_e I_{qr}^* L_s - R_s I_{dr}^*)/U_{dc}^* \\ D_{qr}^* = (-\omega_e L_s I_{dr}^* + \omega_e \Psi_f - R_s I_{qr}^*)/U_{dc}^* \\ U_{dg}^* = \sqrt{\left((1.5 U_s)^2 + \sqrt{(1.5 U_s)^4 - (3 P^{ref} \omega L_g)^2}\right)/4.5} \\ U_{qg}^* = 0 \\ I_{dg}^* = P^{ref}/(1.5 U_{dg}^*) \\ I_{qg}^* = 0 \\ D_{dg}^* = (-I_{qg}^* \omega L_f + U_{dg}^*)/U_{dc}^* \\ D_{qg}^* = (I_{dg}^* \omega L_f + U_{qg}^*)/U_{dc}^* \end{cases}$$

Step 2: modeling the power loop in the MSC controller based on a describing function method, wherein its mathematical expression is:

$$\omega_g^{ref} = \begin{cases} \frac{\varepsilon}{sT_P} \text{sgn}(P^{ref} - P_n), & (\omega_g \leq \omega_{mpp}) \\ -\frac{\varepsilon}{sT_P} \text{sgn}(P^{ref} - P_n), & (\omega_g > \omega_{mpp}) \end{cases}$$

the sign function in the formula can be modeled by using a describing function, and the describing function is:

$$N(A) = \frac{4}{\pi A}$$

Step 3: considering the influence of the weak AC power grid, the weak AC power grid model is:

$$Z_g \cdot \Delta i_{dqg} = \Delta u_{dqg}$$

in the formula $$Z_g = \begin{bmatrix} sL_g & -\omega L_g \\ \omega L_g & sL_g \end{bmatrix}.$$

The small-signal model of the output power of the PMSG-WT is:

$$\Delta P = 1.5 (I^*_{dqg}{}^T \cdot Z_g + U^*_{dqg}{}^T) \cdot \Delta i_{dqg}$$

combing the linear parts of the weak power grid model and the power loop model with the small-signal model of the PMSG-WT in step 1, and deriving a transfer function G(s) of the linear part of the system:

$$G(s) = -\frac{1.5\varepsilon}{T_P s}(I^{*T}_{dqg}Z_g + U^{*T}_{dqg})M_5^{-1}(D^*_{dqg} + G_{udc})M_7^{-1}M_8 \cdot \frac{1}{1+T_f s} \cdot \frac{1}{1+T_P s}$$

where $$M_8 = -D^{*T}_{dqr} \cdot M_1^{-1} \cdot G_{\omega g} + I^{*T}_{dqr} \cdot M_3$$

$$M_7 = \left(\frac{2sC_{dc}}{3} + I^{*T}_{dqg}M_6 - I^{*T}_{dqr}M_4 + D^{*T}_{dqg}M_5^{-1}(D^*_{dqg} + G_{udc}) + D^{*T}_{dqr}M_1^{-1}D^*_{dqr}\right)$$

$$M_6 = (((G_{cg}G_{plli} - G_{pllid}U^*_{dc} + G_{pllu})Z_g + G_{cg})M_5^{-1}(D^*_{dqg} + G_{udc}) + G_{udc})/U^*_{dc}$$

$$M_5 = -G_{cg} + Z_f - (G_{cg}G_{plli} - G_{pllid}U^*_{dc} + G_{pllu})Z_g + Z_g$$

$$M_4 = -M_2 M_1^{-1} D^*_{dqr}/U^*_{dc}$$

$$M_3 = (-M_2 M_1^{-1} G_{\omega g} + G_{\omega g})/U^*_{dc}$$

$$M_2 = G_{\omega e}G_{iq\omega}n_p + G_{cr}G^i_{\theta e} - G_{\omega g}G_{iq\omega} - U^*_{dc}G^d_{\theta e}$$

$$M_1 = G_{cr}G^i_{\theta e} - G_{\omega g}G_{iq\omega} - U^*_{dc}G^d_{\theta e} + z_{dqr}$$

Figure 2:
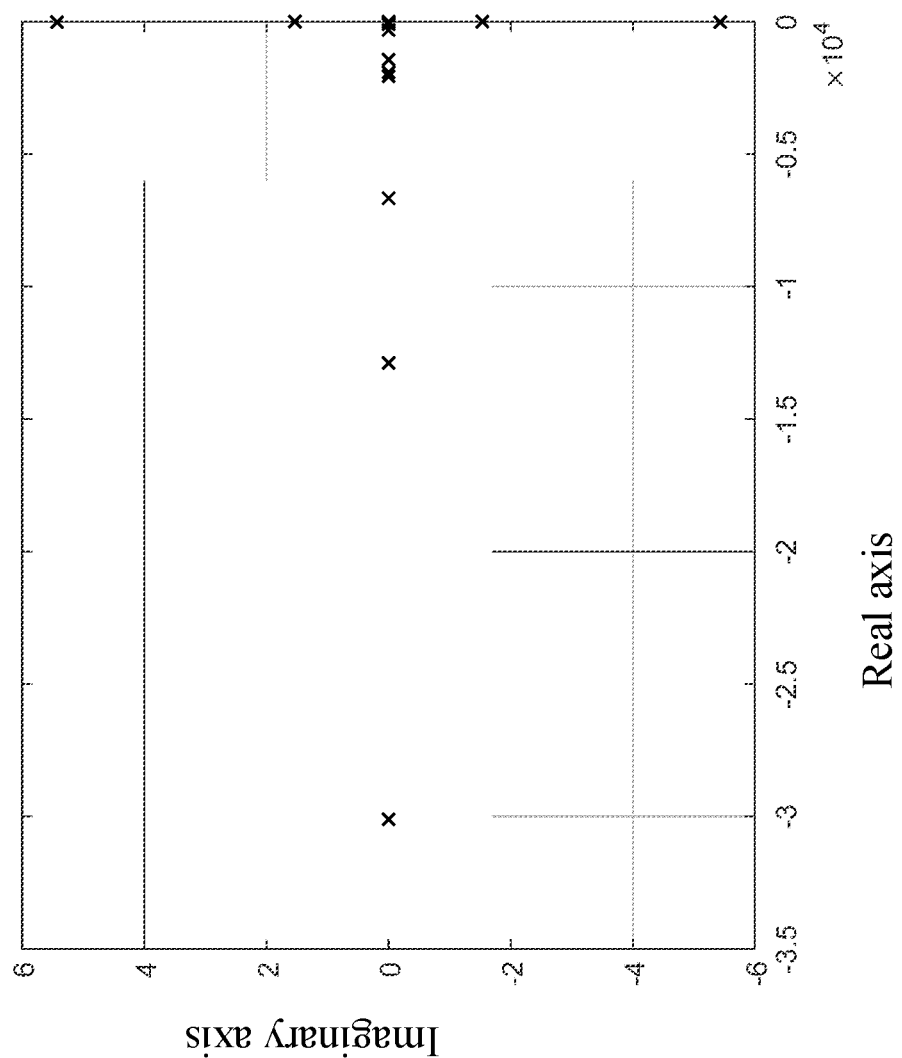
FIG. 2 shows a distribution diagram of G(s) poles.
Figure 3:
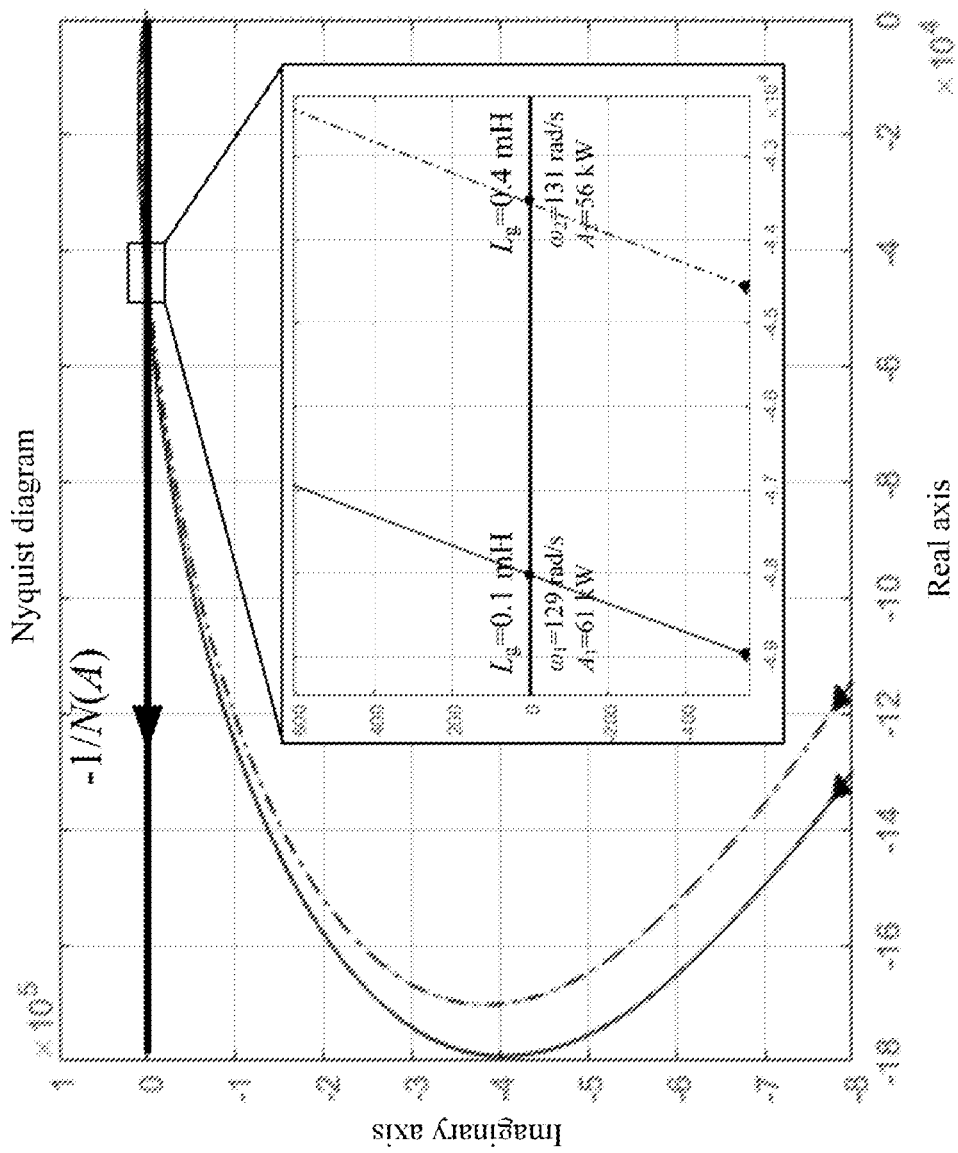
FIG. 3 shows G(s) and $-1/N(A)$ curves when an $L_g$ value is changed.

Step 4: analyzing the stability of the system. Firstly, a G(s) pole diagram is drawn, as shown in FIG. 2, it can be seen that G(s) does not contain the pole of the right half plane (the real part is greater than 0), so the first condition for the stability of the system is satisfied. G(s) and −1/N(A) images are drawn in a complex plane, as shown in FIG. 3, G(s) and −1/N(A) intersect, indicating that the system is in a critically stable state at this time. It can be seen from calculation that, when Lg=0.1 mH, the oscillation frequency of the system is about 129 rad/s (20.5 Hz), and the oscillation amplitude is about 61 kW; and when Lg=0.4 m, the oscillation frequency of the system is about 131 rad/s (20.9 Hz), the oscillation amplitude is about 56 kW. When the power grid strength decreases (Lg increases), the oscillation amplitude of the system decreases, indicating that under certain conditions, the increase of the equivalent impedance of the power grid is conducive to maintaining the stability of the system.

Figure 4A:
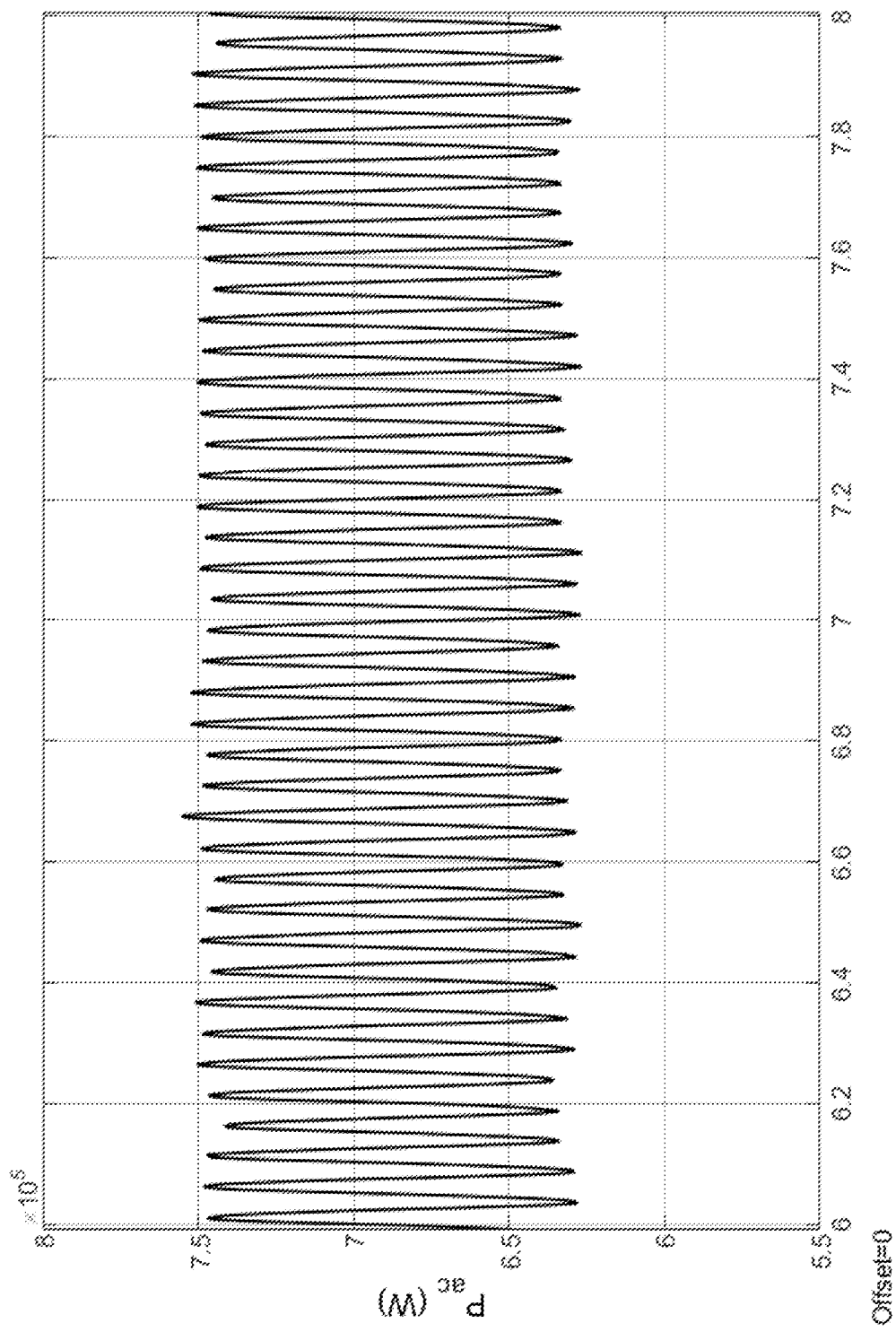
FIG. 4a shows a simulation verification waveform (a) when Lg=0.1 mH.
Figure 4B:
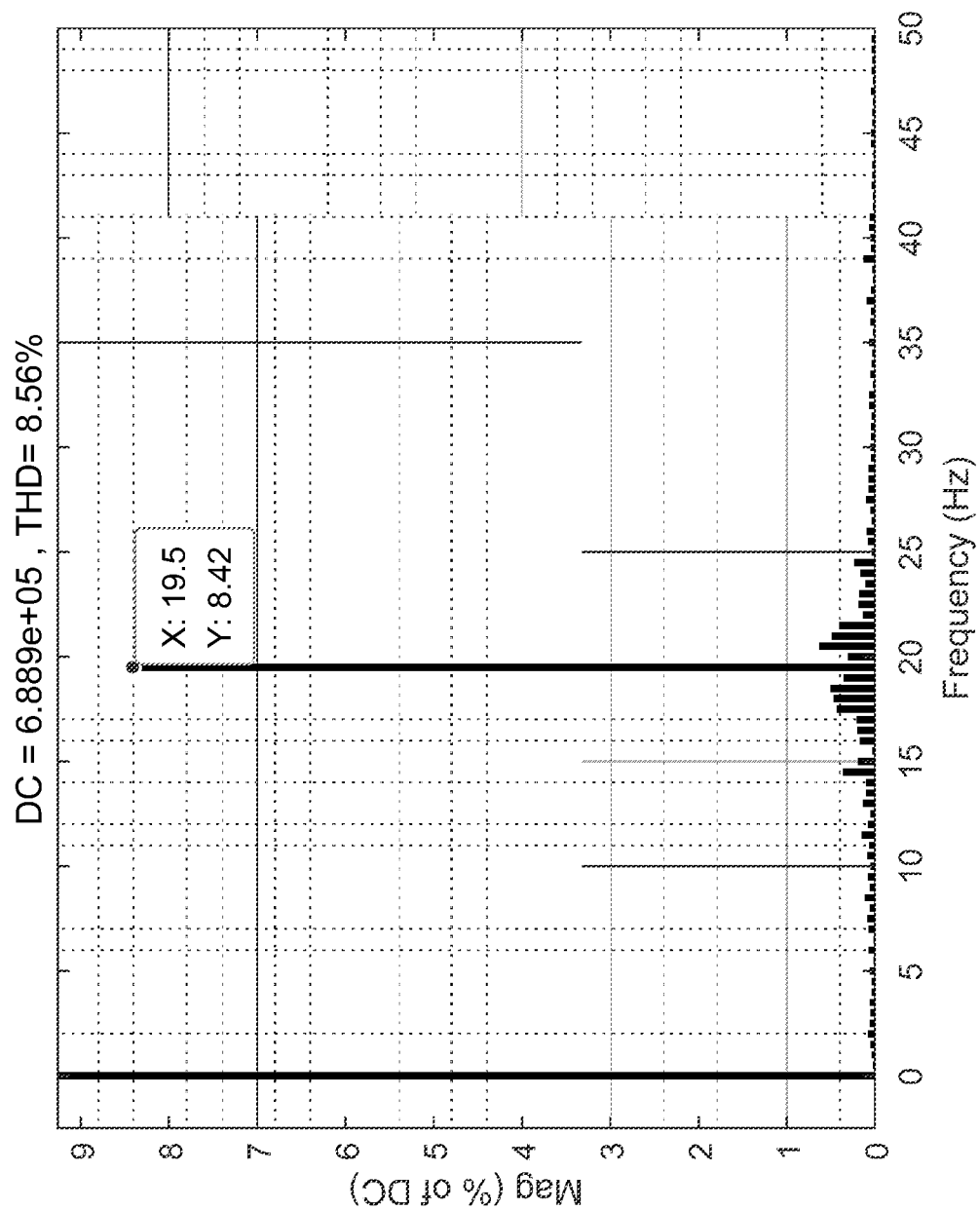
FIG. 4b shows FFT spectrum analysis (b) when Lg=0.1 mH.
Figure 5A:
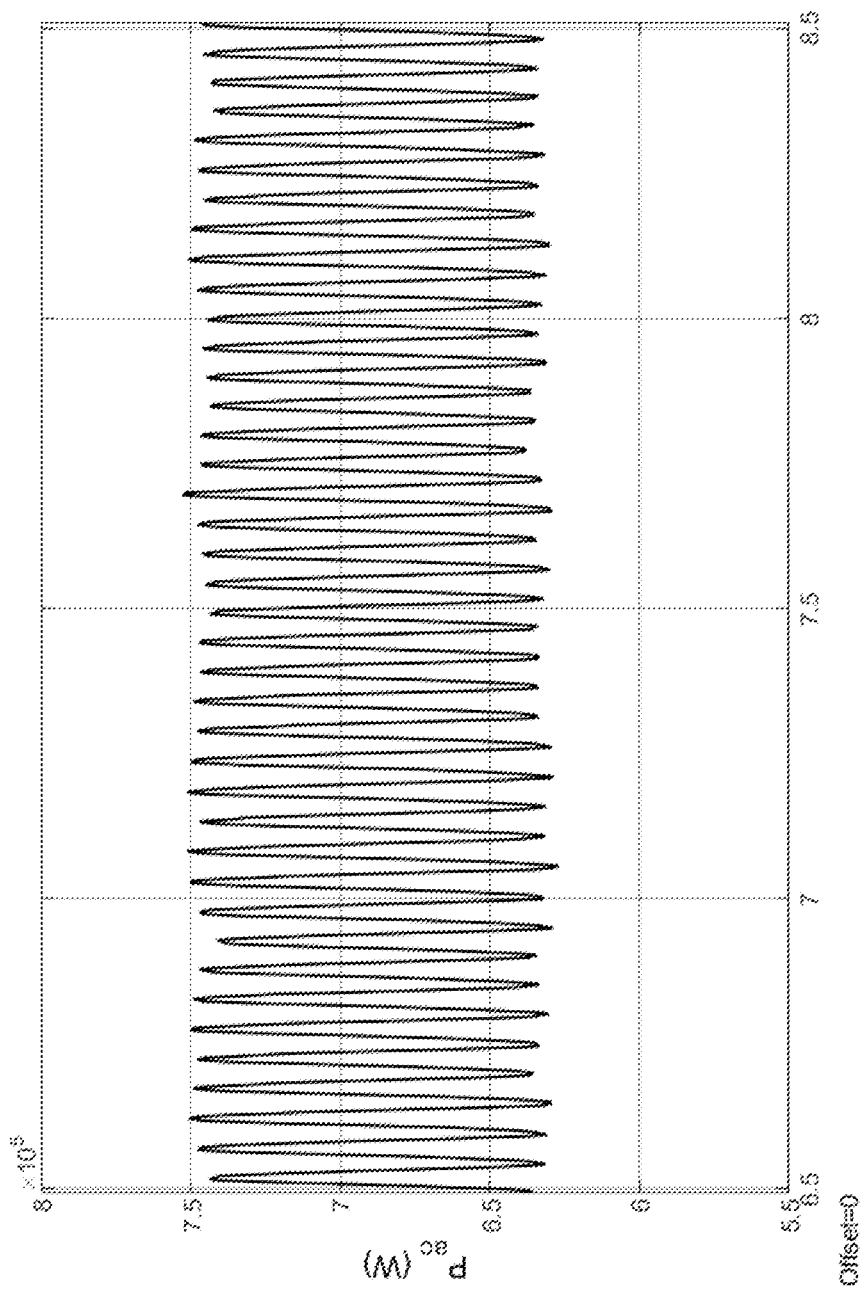
FIG. 5a shows the simulation verification waveform (a) when Lg=0.4 mH.
Figure 5B:
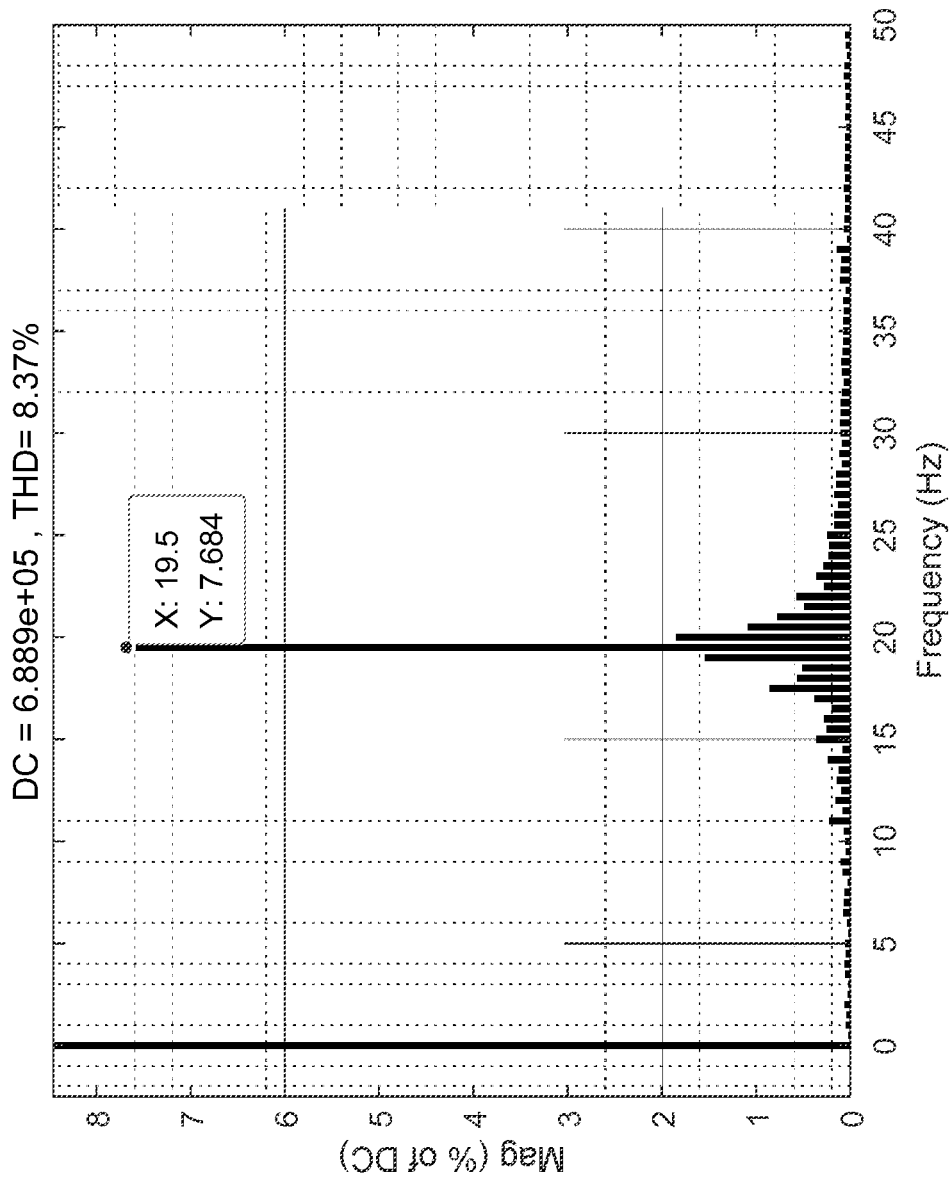
FIG. 5b shows FFT spectrum analysis (b) when Lg=0.4 mH.

FIGS. 4a, 4b, 5a and 5b show system simulation and FFT spectrum analysis results when Lg=0.1 mH and Lg=0.4 mH, respectively. In FIGS. 4a and 4b, the DC component is 0.6889 MW, the corresponding oscillation frequency is 19.5 Hz, and the amplitude is 58 kW, which are basically consistent with the theoretical analysis results; and in FIGS. 5a and 5b, the DC component is 0.6889 MW, the corresponding oscillation frequency is 19.5 Hz, and the amplitude is 53 kW, which are basically consistent with the theoretical analysis results. The simulation results verify the effectiveness and accuracy of the analysis method.

What is claimed is:

1. A method for analyzing stability of a PMSG-WT connected to a weak power grid considering influence of power control, wherein the PMSG-WT comprises a wind turbine, a generator, an MSC, a DC capacitor, a GSC, a filter, an MSC controller, and a GSC controller; the MSC controller comprises a power loop, a rotating speed loop, and a machine-side current loop; the GSC controller comprises a voltage loop and a grid-side current loop; and the method comprises the following steps:
step 1: acquiring main parameters of the PMSG-WT, establishing mathematical models of the wind turbine, the generator and the MSC, the MSC controller, the DC capacitor, the GSC and the filter, and the GSC controller, respectively, performing linearization in a dq coordinate system, and calculating steady-state operation parameters to obtain small-signal models of the wind turbine, the generator and the MSC, the MSC controller, the DC capacitor, the GSC and the filter, and the GSC controller;
step 2: modeling the power loop in the MSC controller based on a describing function method, wherein its mathematical expression is:

$$\omega_g^{ref} = \frac{\varepsilon}{T_P}\int \text{sgn}(P^{ref} - P_n)\text{sgn}(P_n - P_{n-1})\text{sgn}(\omega_{g,n} - \omega_{g,n-1})dt$$

where ε represents a perturbation step length of the power loop, $T_p$ represents a control period of the power loop, $P^{ref}$ represents a reference value of the output power of the PMSG-WT, P represents an output power of the PMSG-WT, $P_n$ represents an output power of the PMSG-WT at a current sampling moment n, $P_{n-1}$ represents an output power of the PMSG-WT at a previous sampling moment, $\omega_g$ represents a rotating speed of the generator, $\omega_g^{ref}$ represents a reference value of the rotating speed of the generator, $\omega_{g,n}$ represents a rotating speed of the generator at the current sampling moment, and $\omega_{g,n-1}$ represents a rotating speed of the generator at the previous sampling moment; sgn(x) is a sign function, when x≥0, sgn(x)=1, and when x<0, sgn(x)=−1; considering an actual power-rotating speed curve of the PMSG-WT, then:

$$\text{sgn}(P_n - P_{n-1})\text{sgn}(\omega_{g,n} - \omega_{g,n-1}) = \begin{cases} 1 & (\omega_g \leq \omega_{mpp}) \\ -1 & (\omega_g > \omega_{mpp}) \end{cases}$$

where $\omega_{mpp}$ represents a rotating speed of the generator at a maximum power point; and then, the power loop model can be simplified as:

$$\omega_g^{ref} = \begin{cases} \frac{\varepsilon}{T_P}\int \text{sgn}(P^{ref} - P_n)dt, & (\omega_g \leq \omega_{mpp}) \\ -\frac{\varepsilon}{T_P}\int \text{sgn}(P^{ref} - P_n)dt, & (\omega_g > \omega_{mpp}) \end{cases}$$

wherein the sign function in the formula can be modeled by using a describing function, and the describing function thereof is:

$$N(A) = \frac{4}{\pi A}$$

in the formula, A represents an amplitude of an input signal;
step 3: considering the influence of the weak AC power grid, combining the linear parts of the small-signal models of the weak power grid and the power loop with the small-signal models established in step 1, and deriving a transfer function G(s) of the linear part of a system; and
step 4: drawing G(s) and −1/N(A) curves in a complex plane, and analyzing the stability of the system based on the describing function method, wherein the method is specifically that if G(s) contains a pole of the right half plane, the system must be unstable; if the G(s) does not contain the pole of the right half plane, then judging the stability of the system through the relationship between a G(s) curve and a −1/N(A) curve:
a. if the G(s) curve does not surround the −1/N(A) curve, the system is stable and does not oscillate;
b. if the G(s) curve and the −1/N(A) curve intersect, the system is critically stable, at this time, the system oscillates at a constant amplitude and a constant frequency, and the frequency and the amplitude of the oscillation can be calculated by the following formula:

$$\begin{cases} G_{Im}(\omega_0) = 0 \\ N(A_0) = -1/G_{Re}(\omega_0) \end{cases}$$

where $G(j\omega)=G_{Re}(\omega)+jG_{Im}(\omega)$, $G_{Re}$ means to find the real part of a complex number, $G_{Im}$ means to find the imaginary part of the complex number, $\omega_0$ represents an angular frequency of the oscillation, and $A_0$ represents the amplitude of the oscillation; and
c. if the G(s) curve surrounds the −1/N(A) curve, the system is unstable.

2. The method according to claim 1, wherein in step 1, the small-signal models of the wind turbine, the generator and the MSC, and the MSC controller are established as follows:
the mathematical model of the wind turbine is established as:

$$sJ\omega_g = T_M - T_e - B\omega_g$$

in the formula, J represents rotational inertia of an equivalent concentrated mass block of the wind turbine and the generator, $T_m$ represents a mechanical torque of the generator, $T_e$ represents an electromagnetic torque of the generator, B represents a self-damping coefficient, it is deemed that B=0 herein, and s represents a parameter introduced by the Laplace transform; linearization is performed on the model to obtain:

$$sJ\Delta\omega_g = \Delta T_m - \Delta T_e$$

the electromagnetic torque of the generator is:

$$T_e = 3/2 n_p \psi_f i_{qr}$$

$n_p$ represents the number of the pole pairs of the generator, $i_{qr}$ represents stator current of the q-axis generator, and $\psi_f$ represents a permanent magnet flux linkage of the generator, and this formula is linearized to obtain:

$$\Delta T_e = 3/2 n_p \psi_f \Delta i_{qr}$$

the mechanical torque of the generator is:

$$T_m = B_t \omega_g$$

in the formula, $$B_t = \frac{dT_m}{d\omega_g}\bigg|_{\omega_g = \omega_g^*}$$

represents a linearization constant of the mechanical torque of the wind turbine, and $\omega_g^*$ represents a steady-state value of the rotating speed of the generator, which is a specific constant at an equilibrium point; and this formula is linearized to obtain:

$$\Delta T_m = B_t \omega_g$$

from this, the small-signal model of the wind turbine can be obtained, $$\Delta\omega_g = \frac{3n_p\psi_f}{2(B_t - sJ)}\Delta i_{qr} = \begin{bmatrix} 0 & \frac{3n_p\psi_f}{2(B_t - sJ)} \end{bmatrix} \cdot \Delta i_{dqr}$$

setting $$G_{iq\omega} = \begin{bmatrix} 0 & \frac{3n_p\psi_f}{2(B_t - sJ)} \end{bmatrix}, \text{ then } \Delta\omega_g = G_{iq\omega} \cdot \Delta i_{dqr}, \Delta\omega_e = n_p G_{iq\omega} \cdot \Delta i_{dqr};$$

the mathematical model of the generator and the MSC is established as:

$$\begin{bmatrix} sL_s + R_s & -\omega_e L_s \\ \omega_e L_s & sL_s + R_s \end{bmatrix} \cdot \begin{bmatrix} i_{dr} \\ i_{qr} \end{bmatrix} = \begin{bmatrix} 0 \\ \omega_e \psi_f \end{bmatrix} - \begin{bmatrix} d_{dr} \\ d_{qr} \end{bmatrix} \cdot u_{dc}$$

in the formula, $R_s$ and $L_s$ represent rotor resistance and armature inductance of the generator, respectively, $\omega_e$ represents an electrical angular speed of the rotor, and $\omega_e = n_p \omega_g$; and the model is linearized to obtain the small-signal model of the generator and MSC:

$$Z_{dqr} \cdot \Delta i_{dqr} = -U^*_{dc} \cdot \Delta d_{dqr} - D^*_{dqr} \cdot \Delta u_{dc} + G_{\omega e} \cdot \Delta\omega_e$$

where $$Z_{dqr} = \begin{bmatrix} sL_s + R_s & -\omega_e^* L_s \\ \omega_e^* L_s & sL_s + R_s \end{bmatrix}, \Delta i_{dqr} = \begin{bmatrix} \Delta i_{dr} \\ \Delta i_{qr} \end{bmatrix},$$

$$\Delta d_{dqr} = \begin{bmatrix} \Delta d_{dr} \\ \Delta d_{qr} \end{bmatrix}, D^*_{dqr} = \begin{bmatrix} D^*_{dr} \\ D^*_{qr} \end{bmatrix}, G_{\omega e} = \begin{bmatrix} L_s I^*_{qr} \\ \psi_f - L_s I^*_{dr} \end{bmatrix};$$

capital letters and superscripts * represent steady-state components of corresponding lowercase variables, and $\Delta$ represents a small-signal component of the corresponding variable;

the mathematical model of the MSC controller is established as:

$$\begin{cases} d^c_{dr} U^*_{dc} = -H_{cr}(0 - i^c_{dr}) + \omega_e L_s i^c_{qr} \\ d^c_{qr} U^*_{dc} = -H_{cr}\left(-H_\omega(\omega_g^{ref} - \omega_g) - i^c_{qr}\right) - \omega_e L_s i^c_{dr} + \omega_e \psi_f \end{cases}$$

where $$H_{cr} = K_{cpr} + \frac{K_{cir}}{s}, K_{cpr}$$

and $K_{cir}$ represent a proportional parameter and an integral parameter of machine-side current loop PI control, respectively, $$H_\omega = K_{\omega p} + \frac{K_{\omega i}}{s},$$

and $K_{\omega p}$ and $K_{\omega i}$ represent the proportional parameter and the integral parameter of rotating speed loop PI control, respectively; superscript c represents a dq coordinate system of the MSC controller; $\omega_g^{ref}$ represents the reference value of the rotating speed of the generator; and by linearizing the model, the small-signal model of the MSC controller can be obtained as:

$$\Delta d_{dqr}^c = \frac{1}{U_{dc}^*}(G_{cr} \cdot \Delta i_{dqr}^c + G_{\omega g}(\omega_g^{ref} - \omega_g) + G_{\omega e} \cdot \Delta \omega_e)$$

where $$G_{cr} = \begin{bmatrix} H_{cr} & \omega_e^* L_s \\ -\omega_e^* L_s & H_{cr} \end{bmatrix}, G_{\omega g} = \begin{bmatrix} 0 \\ H_{cr} H_\omega \end{bmatrix},$$

$\omega_e^*$ represents the steady-state value of the electrical angular speed of the rotor; affected by the disturbance of the rotating speed, the dq coordinate system of the MSC controller will have a phase angle difference with the dq coordinate system of the generator during the dynamic process; the electrical angle of the generator is:

$$\theta_e = n_p \omega_g / s$$

the formula is linearized to obtain:

$$\Delta \theta_e = \frac{n_p \Delta \omega_g}{s} = \frac{3n_p^2 \psi_f}{2s(B_t - sJ)} \Delta i_{qr} = H_{\theta e} \Delta i_{qr}$$

in the formula, $$H_{\theta e} = \frac{3n_p^2 \psi_f}{2s(B_t - sJ)};$$

therefore, the variable conversion relationship between the dq coordinate system of the MSC controller and the dq coordinate system of the generator is:

$$\begin{cases} \Delta i_{dqr}^c = G_{\theta e}^i \cdot \Delta i_{dqr} \\ \Delta d_{dqr}^c = G_{\theta e}^d \cdot \Delta i_{dqr} + \Delta d_{dqr} \end{cases}$$

where $$G_{\theta e}^i = \begin{bmatrix} 1 & H_{\theta e} I_{qr}^* \\ 0 & 1 - H_{\theta e} I_{dr}^* \end{bmatrix}, G_{\theta e}^d = \begin{bmatrix} 0 & H_{\theta e} D_{qr}^* \\ 0 & -H_{\theta e} D_{dr}^* \end{bmatrix};$$

then, the small-signal model of the MSC controller is:

$$G_{\theta e}^d \cdot \Delta i_{dqr} + \Delta d_{dqr} = \frac{1}{U_{dc}^*}(G_{cr} \cdot G_{\theta e}^i \cdot \Delta i_{dqr} + G_{\omega g}(\omega_g^{ref} - \omega_g) + G_{\omega e} \cdot \Delta \omega_e).$$

3. The method according to claim 2, wherein in step 1, the establishment process of the small-signal model of the DC capacitor is as follows:
the mathematical model of the DC capacitor is established as:

$$sC_{dc}u_{dc} = i_{dc2} - i_{dc1} = 1.5(d_{dr}i_{dr} + d_{qr}i_{qr}) - 1.5(d_{dg}i_{dg} + d_{qg}i_{qg})$$

in the formula, $C_{dc}$ represents the DC capacitor, $i_{dc1}$ represents grid-side DC current, $i_{dc2}$ represents machine-side DC current, and by linearizing the model, the small-signal model of the DC capacitor can be obtained as:

$$sC_{dc}\Delta u_{dc} = 1.5(D^{*T}_{dqr} \cdot \Delta i_{dqr} + I^{*T}_{dqr} \cdot \Delta d_{dqr}) - 1.5(D^{*T}_{dqg} \cdot \Delta i_{dqg} + I^{*T}_{dqg} \cdot \Delta d_{dqg})$$

in the formula, $$I_{dqr}^* = \begin{bmatrix} I_{dr}^* \\ I_{qr}^* \end{bmatrix}, \Delta i_{dqg} = \begin{bmatrix} \Delta i_{dg} \\ \Delta i_{qg} \end{bmatrix}, \Delta d_{dqg} = \begin{bmatrix} \Delta d_{dg} \\ \Delta d_{qg} \end{bmatrix}, D_{dqg}^* = \begin{bmatrix} D_{dg}^* \\ D_{qg}^* \end{bmatrix}, I_{dqg}^* = \begin{bmatrix} I_{dg}^* \\ I_{qg}^* \end{bmatrix};$$

and the capital letters and the superscripts * represent the steady-state components of corresponding lower-case variables, and $\Delta$ represents the small-signal component of the corresponding variable.

4. The method according to claim 3, wherein in step 1, the establishment process of the small-signal models of the GSC and the filter, and the GSC controller is as follows:
the mathematical model of the GSC and the filter is established as:

$$\begin{bmatrix} sL_f & -\omega L_f \\ \omega L_f & sL_f \end{bmatrix} \cdot \begin{bmatrix} i_{dg} \\ i_{qg} \end{bmatrix} = \begin{bmatrix} d_{dg} \\ d_{qg} \end{bmatrix} \cdot u_{dc} - \begin{bmatrix} u_{dg} \\ u_{qg} \end{bmatrix}$$

in the formula, $L_f$ represents a filtering inductance, $\omega$ represents a power frequency angular frequency, $\omega = 100\pi$ rad/s, and $u_{dg}$ and $u_{qg}$ represent a d-axis voltage and a q-axis voltage of a grid-connected point, respectively; by linearizing the model, the small-signal model of the GSC and the filter can be obtained as:

$$Z_f \Delta i_{dqg} = U_{dc}^* \cdot \Delta d_{dqg} + D_{dqg}^* \cdot \Delta u_{dc} - \Delta u_{dqg}$$

where $$Z_f = \begin{bmatrix} sL_f & -\omega L_f \\ \omega L_f & sL_f \end{bmatrix}, \Delta i_{dqg} = \begin{bmatrix} \Delta i_{dg} \\ \Delta i_{qg} \end{bmatrix},$$

$$\Delta d_{dqg} = \begin{bmatrix} \Delta d_{dg} \\ \Delta d_{qg} \end{bmatrix}, D_{dqg}^* = \begin{bmatrix} D_{dg}^* \\ D_{qg}^* \end{bmatrix}, \Delta u_{dqg} = \begin{bmatrix} \Delta u_{dg} \\ \Delta u_{qg} \end{bmatrix};$$

the capital letters and the superscripts * represent the steady-state components of corresponding lowercase variables, and $\Delta$ represents the small-signal component of the corresponding variable;
the mathematical model of the GSC controller is established as:

$$\begin{cases} d_{dg}^c U_{dc}^* = u_{dg}^c + H_{cg}(-H_v(U_{dcref} - u_{dc}) - i_{dg}^c) - \omega L_f i_{qg}^c \\ d_{qg}^c U_{dc}^* = u_{qg}^c + H_{cg}(0 - i_{qg}^c) + \omega L_f i_{dg}^c \end{cases}$$

where $$H_{cg} = K_{cpg} + \frac{K_{cig}}{s},$$

$K_{cpg}$ and $K_{cig}$ represent a proportional parameter and an integral parameter of grid-side current loop PI control, respectively, $$H_v = K_{vp} + \frac{K_{vi}}{s},$$

$K_{vp}$ and $K_{vi}$ represent a proportional parameter and an integral parameter of grid-side voltage loop PI control, respectively, and $U_{dcref}$ represents a reference value of the DC voltage; in the GSC controller, a phase-locked loop is used to keep the fan synchronous with the power grid; the superscript c represents the dq coordinate system of the GSC controller; by linearizing the model, the small-signal model of the GSC controller can be obtained as:

$$\Delta d_{dqg}{}^c \cdot U^*{}_{dc} = \Delta u_{dqg}{}^c + G_{cg}\Delta i_{dqg}{}^c + G_{udc}\Delta u_{dc}$$

where $$G_{cg} = \begin{bmatrix} -H_{cg} & -\omega L_f \\ \omega L_f & -H_{cg} \end{bmatrix}, G_{udc} = \begin{bmatrix} H_{cg}H_v \\ 0 \end{bmatrix};$$

in addition, the dynamics of the phase-locked loop should also be considered in the GSC, and its mathematical model is:

$$\theta = H_{pll} \cdot \frac{1}{s} \cdot u_{qg}^c$$

where $$H_{pll} = K_{ppll} + \frac{K_{ipll}}{s},$$

$K_{ppll}$ and $K_{ipll}$ represent a proportional parameter and an integral parameter of a phase-locked loop PI controller, respectively, and $u_{qg}{}^c$ represents the q-axis voltage of the grid-connected point in the dq coordinate system of the GSC controller; the model is linearized to obtain:

$$\Delta\theta = H_{pll} \cdot \frac{1}{s} \cdot \Delta u_{qg}^c$$

wherein there is a certain deviation between the dq coordinate system of the system and the dq coordinate system of the controller, and the two coordinate systems can be converted to each other through the following equation:

$$\begin{cases} \Delta x_d^c = \Delta x_d + \Delta\theta \cdot X_q^* \\ \Delta x_q^c = \Delta x_q + \Delta\theta \cdot X_d^* \end{cases}$$

in the formula, the variables $\Delta x_d$ and $\Delta x_q$ may represent the output current $\Delta i_{dg}$ and $\Delta i_{qg}$ of the GSC, the voltages $\Delta u_{dg}$ and $\Delta u_{qg}$ of the grid-connected point, or the output duty ratios $\Delta d_{dg}$ and $\Delta d_{qg}$ of the grid-side controller, and $X^*{}_q$ and $X^*{}_d$ represent steady-state components $I^*{}_{qg}$, $I^*{}_{dg}$, $U^*{}_{qg}$, $U^*{}_{dg}$, $D^*{}_{qg}$, $D^*{}_{dg}$;

from this, the small-signal model of the phase-locked loop can be derived, namely:

$$\Delta\theta = G_{pll} \cdot \Delta u_{qg}$$

where $$G_{pll} = \frac{H_{pll}}{s + U_{dg}^* H_{pll}},$$

and then the relationship between the dq coordinate system of the controller and the dq coordinate system of the system can be obtained as:

$$\begin{cases} \Delta u_{dqg}^c = G_{pll}^u \cdot \Delta u_{dqg} \\ \Delta i_{dqg}^c = G_{pll}^i \cdot \Delta u_{dqg} + \Delta i_{dqg} \\ \Delta d_{dqg}^c = G_{pll}^d \cdot \Delta u_{dqg} + \Delta d_{dqg} \end{cases}$$

where $G_{pll}^u = \begin{bmatrix} 1 & G_{pll}U_{qg}^* \\ 0 & 1 - G_{pll}U_{dg}^* \end{bmatrix}$, $$G_{pll}^i = \begin{bmatrix} 0 & G_{pll}I_{qg}^* \\ 0 & -G_{pll}I_{dg}^* \end{bmatrix}, G_{pll}^d = \begin{bmatrix} 0 & G_{pll}D_{qg}^* \\ 0 & -G_{pll}D_{dg}^* \end{bmatrix};$$

and then the small-signal model of the GSC controller is converted into:

$$(G_{pll}^d \cdot \Delta u_{dqg} + \Delta d_{dqg}) \cdot U^*{}_{dc} = G_{pll}^u \cdot \Delta u_{dqg} + G_{cg}$$
$$(G_{pll}^i \cdot \Delta u_{dqg} + \Delta i_{dqg}) + G_{udc}\Delta u_{dc}.$$

5. The method according to claim 4, wherein the step 3 specifically comprises:

the AC weak power grid is expressed by series equivalent inductance of an ideal voltage source, and its mathematical model is established as:

$$\begin{bmatrix} sL_g & -\omega L_g \\ \omega L_g & sL_g \end{bmatrix} \cdot \begin{bmatrix} i_{dg} \\ i_{qg} \end{bmatrix} = \begin{bmatrix} u_{dg} \\ u_{qg} \end{bmatrix} - \begin{bmatrix} u_{ds} \\ u_{qs} \end{bmatrix}$$

in the formula, $L_g$ represents the equivalent inductance of the weak grid, $u_{ds}$ and $u_{qs}$ represent ideal voltage source voltages of the d axis and the q axis, respectively, and $i_{dg}$ and $i_{qg}$ represent the d axis current and the q axis current of the AC port of the GSC, respectively; and the formula is linearized to obtain:

$$Z_g \cdot \Delta i_{dqg} = \Delta u_{dqg}$$

in the formula, $$Z_g = \begin{bmatrix} sL_g & -\omega L_g \\ \omega L_g & sL_g \end{bmatrix};$$

the output power of the PMSG-WT is:

$$P = 1.5(i_{dg}u_{dg} + i_{qg}u_{qg})$$

the formula is linearized to obtain:

$$\Delta P = 1.5(I^*{}_{dqg}{}^T \cdot Z_g + U^*{}_{dqg}{}^T) \cdot \Delta i_{dqg}$$

in the formula, $$U_{dqg}^* = \begin{bmatrix} U_{dg}^* \\ U_{qg}^* \end{bmatrix};$$

by combining the small-signal models of the wind turbine, the generator and the MSC, the MSC controller, the DC capacitor, the GSC and the filter, and the GSC controller with the linear part of the power loop, the transfer function G(s) of the linear part of the system can be obtained as:

$$G(s) = -\frac{1.5\varepsilon}{T_P s}\left(I_{dqg}^{*T}Z_g + U_{dqg}^{*T}\right)M_5^{-1}\left(D_{dqg}^* + G_{udc}\right)M_7^{-1}M_8 \cdot \frac{1}{1+T_f s} \cdot \frac{1}{1+1.5T_P s}$$

$$M_8 = -D_{dqr}^{*T} \cdot M_1^{-1} \cdot G_{\omega g} + I_{dqr}^{*T} \cdot M_3$$

-continued $$M_7 = \left(\frac{2sC_{dc}}{3} + I_{dqg}^{*T}M_6 - I_{dqr}^{*T}M_4 + D_{dqg}^{*T}M_5^{-1}(D_{dqg}^* + G_{udc}) + D_{dqr}^{*T}M_1^{-1}D_{dqr}^*\right)$$

$$M_6 = \left(\left(\left(G_{cg}G_{pll}^i - G_{pll}^d U_{dc}^* + G_{pll}^u\right)Z_g + G_{cg}\right)M_5^{-1}(D_{dqg}^* + G_{udc}) + G_{udc}\right)/U_{dc}^*$$

$$M_5 = -G_{cg} + Z_f - \left(\left(G_{cg}G_{pll}^i - G_{pll}^d U_{dc}^* + G_{pll}^u\right)Z_g + Z_g\right)$$

$$M_4 = -M_2 M_1^{-1} D_{dqr}^* / U_{dc}^*$$

$$M_3 = \left(-M_2 M_1^{-1} G_{\omega g} + G_{\omega g}\right)/U_{dc}^*$$

$$M_2 = G_{\omega e} G_{iq\omega} n_p + G_{cr} G_{\theta e}^i - G_{\omega g} G_{iq\omega} - U_{dc}^* G_{\theta e}^d$$

$$M_1 = G_{cr} G_{\theta e}^i - G_{\omega g} G_{iq\omega} - U_{dc}^* G_{\theta e}^d + Z_{dqr}$$

in the formula, $T_f$ represents the period of a power sampling filter, $1/(1+T_f s)$ represents the delay of the power sampling filter, and $1/(1+1.5T_p s)$ represents the delay of the controller and the PWM.

* * * * *